United States Patent
Loboda et al.

(10) Patent No.: US 6,593,248 B2
(45) Date of Patent: Jul. 15, 2003

(54) METHOD FOR PRODUCING HYDROGENATED SILICON OXYCARBIDE FILMS HAVING LOW DIELECTRIC CONSTANT

(75) Inventors: Mark Jon Loboda, Bay City, MI (US); Byung Keun Hwang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/103,331

(22) Filed: Mar. 20, 2002

(65) Prior Publication Data

US 2002/0173172 A1 Nov. 21, 2002

Related U.S. Application Data

(60) Provisional application No. 60/278,211, filed on Mar. 23, 2001.

(51) Int. Cl.[7] ............................................. H01L 21/31
(52) U.S. Cl. ..................... 438/758; 438/778; 438/780
(58) Field of Search ............................... 438/758, 778, 438/773, 774, 780

(56) References Cited

U.S. PATENT DOCUMENTS

| | | | |
|---|---|---|---|
| 5,989,998 A | 11/1999 | Sugahara et al. | ............ 438/623 |
| 6,149,976 A | 11/2000 | Matsuki et al. | ......... 427/255.37 |
| 6,458,718 B1 * | 10/2002 | Todd | ........................ 438/778 |

OTHER PUBLICATIONS

1988 DUMIC Conference Proceedings, 2/98, Low Dielectric Constant Oxide Films Deposited Using CVD Techniques, S. McClatchie, K. Beekmann, A. Kiermasz, p, 311–318.

Kim, D. S. and Lee, Y. H.; Deposition of Fluorinated a–SiC:H Films at Room Temperature; Department of Chemical Engineering, Drexel University, Philadelphia, Pennsylvania 19104; J. Electrochem. Soc., vol. 141, No. 12, Dec. 1994, pp. 3562–3571.

Shi–Jin Ding et al., Low Dielectric constant SiO2:C,F Films Prepard from Si(OC2H55)4/C4F8/Ar by Plasma–Enhanced CVD, Chemical Vapor Deposition 2001, 7, No. 4, pp. 142–146.

M. Maisonneuve et al., Electrical Properties of Metal–Polymer (Polysiloxane)–Silicon Structures and Application of (Polysiloxane)–Silicon Structures and Application of Polysiloxane to the Passivation of Semiconductor Devices, Thin Solid Films, 1976, V. 33(I), pp. 35–41.

G. W. Hill, Electron Beam Polymerization of Insulating Films, Microelectronics and Reliability, Pergamon Press, 1965., vol. 4, pp. 109–116.

* cited by examiner

*Primary Examiner*—John F. Niebling
*Assistant Examiner*—Olivia T Luk
(74) *Attorney, Agent, or Firm*—Sharon K. Severance

(57) ABSTRACT

A method for producing fluorinated hydrogenated silicon oxycarbide (H:F:SiOC) and amorphous fluorinated hydrogenated silicon carbide (H:F:SiC) films having low dielectric permittivity. The method comprises reacting a silicon containing compound with a fluorocarbon or fluorohydrocarbon compound having an unsaturated carbon bonded to F or H. The resulting films are useful in the formation of semiconductor devices.

21 Claims, No Drawings

METHOD FOR PRODUCING HYDROGENATED SILICON OXYCARBIDE FILMS HAVING LOW DIELECTRIC CONSTANT

This application claims the benefit of U.S. Provisional Application No. 60/278,211 filed Mar. 23, 2001.

FIELD OF THE INVENTION

This invention is a method for producing fluorinated hydrogenated silicon oxycarbide (H:F:SiOC) and amorphous fluorinated hydrogenated silicon carbide (H:F:SiC) films having low dielectric permittivity. The method comprises reacting a silicon containing compound with a fluorocarbon or fluorohydrocarbon compound having an unsaturated carbon bonded to F or H. The resulting films are useful in the formation of semiconductor devices.

BACKGROUND OF THE INVENTION

The use of chemical vapor deposition (CVD) to produce $SiO_2$, SiNC or SiC thin films on semiconductor devices from silicon-containing materials such as silane ($SiH_4$), tetraethyl orthosilicate (TEOS), silacyclobutanes, and alkylsilanes such as trimethylsilane has been disclosed in the art. Chemical vapor deposition processes typically comprise introducing the gaseous silicon-containing material and a reactive gas into a reaction chamber containing the semiconductor substrate. An energy source such as thermal or plasma induces the reaction between the silicon-containing material and reactive gas thereby resulting in the deposition of the thin film of $SiO_2$, SiNC or SiC on the semiconductor device. Plasma enhanced chemical vapor deposition (PECVD) is typically carried out at low temperatures (<500° C.) thereby making PECVD a suitable means for producing dielectric and passivation films on semiconductor devices.

As semiconductor device structures become increasingly smaller the dielectric constant as well as the integrity of the film become important. Films produced by known CVD processes have high dielectric constants (i.e. 3.8 or greater). Therefore there is a need for processes and materials that result in low dielectric constant films. A new deposition processes known as Low-k Flowfill®, produces films having a dielectric constant of <3.0. This method uses a chemical vapor deposition reaction between methylsilane and hydrogen peroxide to produce a methyl doped silicon oxide film (See S. McClatchie, K. Beekmann, A. Kiermasz; *Low Dielectric Constant Oxide Films Deposited Using CVD Techniques,* 1988 DUMIC Conference Proceedings, February 1998, p. 311–318). However, this process requires a non standard CVD system, the use of a lower stability oxygen source (hydrogen peroxide) and generates water as a by-product which can be undesirable in semiconductor devices.

It is therefore an object of this invention to provide a method for producing low dielectric permittivity films of fluorinated hydrogenated silicon oxycarbide and fluorinated hydrogenated silicon carbide by plasma assisted polymerization of mixtures of organosilane compounds, fluorine and oxygen containing gases.

SUMMARY OF THE INVENTION

This invention pertains to a method of producing thin films of amorphous fluorinated hydrogenated silicon carbide (H:SiC) and hydrogenated fluorinated silicon oxycarbide (H:SiOC) having low dielectric permittivity on substrates, preferably semiconductor devices. The method comprises the plasma assisted polymerization of at least one Si containing compound and at least one fluorocarbon or fluorohydrocarbon compound having at least one unsaturated carbon bonded to F or H. An oxygen containing gas is optionally added to produce the H:F:SiOC films. These films have a low dielectric constant and are particularly suited as interlayer dielectrics.

DETAILED DESCRIPTION OF THE INVENTION

This invention pertains to a method for producing amorphous fluorinated hydrogenated silicon carbide and fluorinated hydrogenated silicon oxycarbide films on substrates, preferably semiconductor substrates. The method for producing the films comprises the plasma assisted polymerization of a silicon containing compound and a fluorocarbon or fluorohydrocarbon compound having at least one unsaturated carbon bonded to F or H ("fluorocarbon compound"). An oxygen providing gas may also be present to introduce oxygen into the films.

By "semiconductor substrate" it is meant to include, but not be limited to, silicon based devices and gallium arsenide based devices intended for use in the manufacture of a semiconductor components including focal plane arrays, opto-electronic devices, photovoltaic cells, optical devices, transistor-like devices, 3-D devices, silicon-on-insulator devices, super lattice devices and the like. The semiconductor substrates may contain one or more layers of wiring. The semiconductor substrate may also be those substrates prior to the formation of any wiring layers.

The amorphous fluorinated hydrogenated silicon carbide films produced herein may be represented by the general formula $Si_aC_bH_cF_d$ wherein the ratio of C:Si can be in the range of about 1:1 to about 10:1 with the hydrogen level being in the range of greater than 0 to up to about 40 atomic % based on all atoms in the film. The amount of fluorine (F) in the films will typically be in the range of 0.01 to up to 15 atomic % based on all the atoms in the film. Typically there will be some oxygen contaminant in the fluorinated hydrogenated silicon carbide films. The oxygen contaminant will typically be less than 3 atomic % based on all atoms in the film and more typically in the range of 1 to 3 atomic % based on all atoms in the film.

The fluorinated hydrogenated silicon oxycarbide films produced herein may be represented by the general formula $Si_vC_wO_xH_yF_z$ wherein the ratio of C:Si can be in the range of about 1:3 to about 10:1 and the ratio of Si:O can be in the range of about 1:1 to about 20:1 with the balance being hydrogen and fluorine. The amount of hydrogen is typically in the range of 0.0–40 atomic % based on all the atoms in the film. The amount of fluorine is typically in the range of 0.01–15 atomic % based on all the atoms in the film.

Silicon containing compounds useful in producing the thin films include, but are not limited to silanes, organosilanes, polycarbosilanes, cyclic siloxanes, and linear siloxanes. Useful silicon containing compounds are disclosed in detail in U.S. Pat. No. 6,162,742, herein incorporated by reference for its teaching of silicon containing compounds. The silicon containing compounds typically contain a unit having the formula R—Si where the R group is selected from a hydrogen atom, a fluorine atom, a fluoro substituted organo group, or an organo group. R is preferably an alkyl group, more preferably a methyl group. The Si atom may be bonded to additional R groups (organo silanes), other Si atoms through hydrocarbon groups (polycarbosilanes) or other Si atoms through O atoms (siloxanes). Preferred silicon containing compounds are those that are gases or liquids near room temperature and can be volatilized above about 10 Torr.

The silicon containing compounds useful in producing the films may be exemplified by, but not limited to, silane, tetrafluorosilane, trifluoromethyl trifluorosilane, methylsilane, dimethylsilane trimethylsilane, tetramethylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, 1,3-dimethylsiloxane, 1,3-bis(silanomethylene)disiloxane, bis(1-methyldisiloxanyl)propane, 2,4,6,8-tetramethylcyclotetrasiloxane, 2,4,6,8,10-pentamethylcyclopentasiloxane, 1,3,5,7-tetrasilano-2,6-dioxy-4,8-dimethylene, tetrapropargylsilane, tetraethynylsilane, phenylsilanes, silacyclobutane ($H_2SiC_3H_6$) and derivatives such as 1,1-difluorosilacyclobutane, 1-methylsilacyclobutane, 1,1-dimethylsilacyclobutane, 1,1-ethylmethylsilacyclobutane, 1-butylsilacyclobutane, 2,4-dimethylsilacyclobutane, 3,3-diethylsilacyclobutane, and 3,3-ethylpropylsilacyclobutane, 1,3-disilacyclobutane and derivatives such as 1,1,3,3-tetrafluoro-1,3-disilacyclobutane, 1-methyl-1,3-disilacyclobutane, 1,3-dimethyl-1,3-disilacyclobutane, 1,1-ethylmethyl-1,3-disilacyclobutane, 1-butyl-1,3-disilacyclobutane, 2,4-dimethyl-1,3-disilacyclobutane, 2,2-diethyl-1,3-disilacyclobutane, and 2,4-ethylpropyl-1,3-disilacyclobutane. A combination of two or more silicon containing compounds can be employed to provide a blend of desired properties such as dielectric constant, oxide content, hydrophobicity, film stress and plasma etching characteristics.

When the silicon-containing compound does not contain sufficient carbon to produce the desired films, carbon may be introduced through the fluorocarbon compound or through the use of a hydrocarbon such as methane.

Fluorocarbons or fluorohydrocarbons having at least one unsaturated carbon bonded to F or H ("fluorocarbon compound") useful in producing the thin film include hexafluoropropene, trifluoromethylpropene, di- or trifluorobenzene, di(trifluoromethylbenzene), octafluorotoluene and others.

Amount of F to Si containing material. The ratios of the Si-containing gas flow to the F containing gas flow would range 1:3 to 10:1.

A controlled amount of oxygen may be present in the deposition chamber when it is desired to produce a F:H:SiOC film. The oxygen may be controlled by the type of oxygen providing gas used, or by the amount of oxygen providing gas that is used. If too much oxygen is present in the deposition chamber a silicon oxide film with a stoichiometry close to $SiO_2$ will be produced and the dielectric constant will be higher than desired. Oxygen providing gases include, but are not limited to air, ozone, oxygen, nitrous oxide and nitric oxide, preferably nitrous oxide. The amount of oxygen providing gas is typically less than 5 volume parts oxygen providing gas per volume part of silicon containing compound, more preferably from 0.01 to 4.5 volume parts of oxygen providing gas per volume part of silicon containing compound. One skilled in the art will be able to readily determine the amount of oxygen providing gas based on the type of oxygen providing gas and the deposition conditions.

In addition to the oxygen providing gas, oxygen may be introduced into the films from the use of silicon containing compounds that contain oxygen, for example, 2,4,6,8-tetramethylcyclotetrasiloxane, 2,4,6,8,10-pentamethylcyclopentasiloxane.

Other materials may be present in the reactive gas mixture. For example, carrier gases such as helium or argon, dopants such as phosphine or diborane, halogens such as fluorine, hydrocarbons such as methane or any other material that provides additional desirable properties to the film may be present.

The reactive gas mixture of silicon containing compound, fluorocarbon compound and optional components is introduced into a deposition chamber containing a substrate, preferably an semiconductor substrate, wherein the plasma assisted polymerization of the silane compound is induced resulting in the deposition of a film on the substrate wherein the film comprises hydrogen, silicon, carbon, fluorine and optionally, oxygen and has a low dielectric constant ($\geq 2.0$ to $\leq 3.6$) on the substrate. Plasma enhanced chemical vapor deposition (PECVD) is preferred due to the low temperatures that can be used and wide use in the industry.

In PECVD the gas mixture is reacted by passing it through a plasma field. The plasmas used in such processes comprise energy derived from a variety of sources such as electric discharges, electromagnetic fields in the radio-frequency or microwave range, lasers or particle beams. Generally preferred in the plasma deposition processes is the use of radio frequency (10 kHz to $10^2$ MHz) or microwave (1.0 to 10 GHz) energy at moderate power densities (0.1 to 5 watts/$cm^2$). The specific frequency, power and pressure, however are generally tailored to the equipment. Preferably the films are produced using PECVD at a power of 20 to 1000 W; a pressure of 1 to 50,000 mTorr; and a temperature of 25 to 500° C. Confined, low pressure (1–5 mTorr) microwave frequency plasmas, often referred to as high density plasmas, can be combined with a RF frequency excitation in a process which helps planarize a varying surface topography during CVD growth.

The films produced herein may be of varying thicknesses. Films having thicknesses of 0.01 to 10 μm may be produced by the method of this invention. Preferably the films have a thickness of 0.5 to 3.0 μm.

An advantage to the method of this invention is the ability to link successive growth processes to produce multilayer structures for example of $SiO_2$/F:H:SiOC/$SiO_2$ or SiC:H/F:H:SiOC/SiC:H by increasing or deleting the oxygen providing gas and/or fluorine compound at the appropriate time during the CVD process. It is preferred to produce discreet layers by stopping the reactive gas flow, adjusting the amount of oxygen providing gas and/or fluorine compound and thereafter resuming the reactive gas flow to produce the next layer.

The films produced herein, due to the low dielectric constant, are particularly suited as interlayer dielectrics in semiconductor integrated circuit manufacturing including, but not limited to, gate dielectrics, premetal and intermetal dielectrics and passivation coatings. The films produced herein have a dielectric constant of $\geq 2.0$ to $\leq 3.6$, preferably $\geq 2.0$ to $\leq 3.0$.

With the industry requirement to minimize the electrical RC (resistance*capacitance) delay associated with the circuit interconnections, new low permittivity dielectrics are required for use as isolation materials between adjacent conductors. While many candidate film materials exist with relative dielectric constant, k, in the range 3.5<k<2.5, few have lower permittivity. Among the materials with k<2.5 are amorphous carbon alloys, fluorinated amorphous carbon alloys, and forms of porous silicon oxide.

Very low density films which would be F:H:SiOC alloys can be formed by simultaneous plasma polymerization of the silicon containing compound, fluorine compound and an oxygen containing gas. It is expected that these films will have dielectric properties similar to porous silicon oxides. The incorporation of fluorine into the film can help to further lower the permittivity. Fluorine has a depolarizing effect on silicon bonds, and can produce an overall lower dielectric permittivity film compared to the same silicon material without fluorine.

The advantage in the use of the fluorine compound is the incorporation of F into the film from CF radicals. Incorporation in this manner should be more efficient and result in higher thermal stability fluorine bonds. Also, by controlling the relative generation of CF radicals compared to F radicals, the etching of the film by F radicals can be reduced, thus minimizing film densification during growth. Minimizing the density helps to reduce permittivity.

This method for incorporation of fluorine can be used in processes to further reduce permittivity in new lower permittivity dielectric films based on amorphous SiCH and amorphous SiCOH alloy materials. These materials are useful in integrated circuit fabrication applications such as intermetal dielectric isolation layers and as diffusion barriers.

The following non-limiting examples re provided so that one skilled in the art may more readily understand the invention.

EXAMPLES

Example 1

Hexafluoropropene (HFP) was added during the PECVD process for the deposition of SiC:H or SiCO:H using trimethylsilane ("TMS"). The films were grown on bare silicon wafers as the substrate using a capacitavely coupled parallel plate PECVD reactor. In the case of HFP doped SiC:H film growth, a mixture of TMS, HFP, and helium (He) was used in PECVD process. For HFP doped SiCO:H film growth, nitrous oxide ($N_2O$) was another added gas in the mixture above. The PECVD parameters, dielectric constant, growth rate for HFP-doped SiC:H are in Table 1. The typical composition and density of the films produced in examples are in Table 2.

TABLE 1

HFP-doped SiC:H

| Run No. | Growth Temperature (° C.) | Press. (Torr) | Power (W) | TMS (sccm) | $N_2O$ (sccm) | He (sccm) | HFP (sccm) | Growth Rate (Å/min) | K @ as dep film (MIM) | Refractive Index @ 632 nm |
|---|---|---|---|---|---|---|---|---|---|---|
| 1 | 400 | 5 | 500 | 250 | 0 | 470 | 30 | 830 | 4.635 | 1.9097 |
| 2 | 400 | 5 | 500 | 250 | 0 | 450 | 50 | 1200 | 4.292 | 1.785 |
| 3 | 400 | 5 | 500 | 250 | 0 | 420 | 80 | 1848 | 3.812 | 1.6354 |
| 4 | 400 | 5 | 500 | 250 | 0 | 380 | 120 | 2358 | 3.574 | 1.5572 |
| 5 | 400 | 5 | 500 | 250 | 0 | 350 | 150 | 2224 | 3.664 | 1.5621 |
| 6 | 370 | 8.7 | 585 | 210 | 0 | 600 | 0 | 1292 | 5.125 | 1.9787 |
| 7 | 370 | 9.2 | 550 | 184 | 0 | 526 | 31.7 | 1535 | 4.307 | 1.665 |
| 8 | 370 | 9.2 | 550 | 184 | 0 | 526 | 95.2 | 2542 | 3.601 | 1.574 |
| 9 | 370 | 9.2 | 550 | 184 | 0 | 526 | 132.3 | 2852 | 3.667 | 1.600 |
| 10 | 370 | 8.7 | 550 | 184 | 0 | 526 | 132.3 | 2963 | 3.660 | 1.592 |
| 11 | 370 | 8.7 | 550 | 184 | 0 | 526 | 169.3 | 3510 | 3.645 | 1.591 |
| 12 | 370 | 5.5 | 750 | 250 | 340 | 0 | 63.5 | 9704 | 3.062 | 1.432 |
| 13 | 370 | 5.5 | 750 | 250 | 340 | 0 | 132.3 | 6370 | 3.4 | 1.453 |

TABLE 2

| Run No. | Si atom % | H atom % | O atom % | C atom % | F atom % | Density (grams/cc) | C/Si | J[1] @ 0.5 MV/cm | J @ 1 MV/cm | BD[2] @ $10^{-3}$ A/cm² | BTS[3] |
|---|---|---|---|---|---|---|---|---|---|---|---|
| 1 | 0.23 | 0.3 | 0.06 | 0.38 | 0.03 | 1.61 | 1.65 | $4.65 \times 10^{-10}$ | $2.87 \times 10^{-9}$ | 3.1 | — |
| 3 | 0.16 | 0.37 | 0.07 | 0.33 | 0.07 | 1.35 | 2.06 | $9.31 \times 10^{-11}$ | $6.96 \times 10^{-10}$ | 4.4 | $>10^5$ sec. |
| 4 | 0.1 | 0.37 | 0.09 | 0.38 | 0.06 | 1.17 | 3.80 | — | — | — | — |
| 6 | 0.32 | 0.31 | 0.07 | 0.30 | 0 | 1.5 | 0.938 | $3.12 \times 10^{-10}$ | $2.44 \times 10^{-9}$ | 3.1 | — |

[1] J = Leakage current density (A/cm²);
[2] BD = Breakdown Field (MV/cm);
[3] BTS = Bias-Temperature Stress Test @ 250° C., 2.5 MV/cm, N2 ambient As the HFP flow amount increase, the C/Si ratio and the growth rate increase. At the same time the values of K and the refractive index (RI) decrease. As the CI radicals from the HFP raises the flux of carbon containing moiety at the surface, increasing the carbon content and film thickness. The reduction of dielectric constant caused by the CFx insertion, is due to both carbon and fluorine incorporation. Since carbon has lower mass than Si, the density of the film drops (see Table 2), which reduces the bulk polarizability and hence the dielectric constant. In addition, fluorine helps de-polarize Si bonds, helping to reduce k. The PECVD parameters, dielectric constant for HFP-doped SiCO:H are in Table 3.

TABLE 3

| Run No. | Growth Temperature (° C.) | Power (W) | Pressure (torr) | TMS (sccm) | He (sccm) | HFP (sccm) | N2O (sccm) | K (MIM) @ as dep film | K* (MIM) @ post-annealed film |
|---|---|---|---|---|---|---|---|---|---|
| 14 | 275 | 250 | 3.5 | 50 | 500 | 25 | 300 | 3.296 | 2.924 |
| 15 | 275 | 250 | 3.5 | 75 | 500 | 25 | 400 | 3.213 | 3.066 |
| 16 | 275 | 350 | 3.5 | 100 | 500 | 10 | 440 | 3.285 | 3.112 |
| 17 | 275 | 350 | 3.5 | 100 | 500 | 25 | 500 | 3.399 | 3.061 |
| 18 | 275 | 350 | 3.5 | 100 | 500 | 75 | 700 | 3.566 | 2.988 |

*Post-annealed at 400° C. for 1 hour in $N_2$ ambient.

There was no metal adhesion or thermal instability observed in the two film types. This is an advantage of the organo-Si+HFP chemistry, as the Si content supports better adhesion than typically associated with a-CF:H materials.

Comparative Example 1

The same process was used as in Example 1 except that $CF_4$ was used in place of the HPF. Results are in Table. 4.

TABLE 4

Example of $CF_4$-doped SiC:H or SiCO:H

| Run No. | Temp Deg (° C.) | Power (W) | Press. (Torr) | TMS (SCCM) | He SCCM | $N_2O$ (SCCM) | $CF_4$ (SCCM) | K (MIM) @ as dep film | K (MIM) @ post-annealed film at 400° C. |
|---|---|---|---|---|---|---|---|---|---|
| C1 | 250 | 600 | 7.0 | 100 | 800 | 100 | 800 | 3.158 | 3.158 |
| C2 | 250 | 600 | 7.0 | 100 | 100 | 800 | 800 | 3.263 | 3.263 |
| C3 | 250 | 900 | 4.0 | 400 | 100 | 800 | 100 | 3.224 | 3.224 |
| C4 | 250 | 600 | 7.0 | 400 | 800 | 800 | 800 | 3.058 | 3.058 |
| C5 | 250 | 600 | 4.0 | 100 | 100 | 800 | 100 | 3.192 | 3.192 |
| C6 | 250 | 600 | 7.0 | 400 | 800 | 800 | 100 | 2.903 | 2.903 |
| C7 | 250 | 900 | 7.0 | 400 | 100 | 100 | 100 | 2.881 | 2.881 |
| C8 | 250 | 600 | 4.0 | 400 | 800 | 100 | 100 | 3.331 | 3.331 |
| C9 | 250 | 600 | 7.0 | 400 | 100 | 100 | 800 | 2.965 | 2.965 |
| C10 | 370 | 700 | 7.0 | 200 | 200 | 0 | 150 | 4.432 | 4.312 |
| C11 | 370 | 700 | 7.0 | 200 | 200 | 0 | 300 | 4.514 | 4.464 |
| C12 | 370 | 700 | 7.0 | 200 | 200 | 0 | 600 | 4.504 | 4.295 |
| C13 | 370 | 700 | 7.0 | 200 | 200 | 0 | 900 | 4.501 | 4.406 |
| C14 | 370 | 700 | 7.0 | 200 | 200 | 0 | 1200 | 4.602 | 4.537 |

What is claimed is:

1. A chemical vapor deposition method for producing fluorinated hydrogenated silicon carbide films comprising
   introducing a reactive gas mixture comprising a silicon containing compound and a fluorocarbon compound into a deposition chamber containing a substrate
   inducing a reaction between the silicon containing compound and fluorocarbon compound at a temperature of 25° C. to 500° C. to provide a film comprising hydrogen, silicon, carbon and fluorine
   wherein the film has the formula $Si_aC_bH_cF_d$ wherein the ratio of b:a is in the range of about 1:1 to about 10:1;
   c is greater than 0 to up to about 40 atomic % based on all the atoms in the film and d is in the range of 0.01 up to 15 atomic % based on all the atoms in the film.

2. The method as claimed in claim 1 wherein the ratio of silicon-containing compound to the fluorocarbon compound in the deposition chamber is in the range of 1:3 to 10:1.

3. The method as claimed in claim 1 wherein the silicon containing compound is a methyl-containing silane.

4. The method as claimed in claim 3 wherein the methyl containing silane is trimethylsilane.

5. The method as claimed in claim 1 wherein the fluorocarbon is selected from group consisting of hexafluoropropene, trifluoromethylpropene, di- or tri-fluorobenzene, di(trifluoromethylbenzene), and octafluorotoluene.

6. The method as claimed in claim 1 wherein the fluorocarbon compound is hexafluoropropene.

7. The method as claimed in claim 1 wherein the reactive gas mixture additionally comprises a carrier gas.

8. The method as claimed in claim 1 wherein the reaction is induced by exposing the reactive gas mixture to plasma at a power of 20 to 1000 W, a pressure of 1 to 10,000 mTorr and a temperature of 25 to 500° C.

9. A chemical vapor deposition method for producing fluorinated hydrogenated silicon oxycarbide films comprising introducing a reactive gas mixture comprising a silicon containing compound, a fluorocarbon compound and an oxygen providing gas into a deposition chamber containing a substrate inducing a reaction between the silicon containing compound and fluorocarbon compound at a temperature of 25° C. to 500° C.

wherein there is a controlled amount of oxygen present during the reaction to provide film comprising hydrogen, silicon, carbon, oxygen and fluorine wherein the film has the formula $Si_aC_bH_cF_d$ wherein the ratio of b:a is in the range of about 1:1 to about 10:1; c is greater than 0 to up to about 40 atomic % based on all the atoms in the film and d is in the range of 0.01 up to 15 atomic % based on all the atoms in the film.

10. The method as claimed in claim 9 wherein the ratio of silicon-containing compound to the fluorocarbon compound in the deposition chamber is in the range of 1:3 to 10:1.

11. The method as claimed in claim 9 wherein there is about 0.01 to about 4.5 volume parts of oxygen providing gas per volume of silicon containing compound.

12. The method as claimed in claim 9 wherein the silicon containing compound is a methyl-containing silane.

13. The method as claimed in claim 12 wherein the methyl containing silane is trimethylsilane.

14. The method as claimed in claim 9 wherein the fluorocarbon selected from group consisting of hexafluoropropene, trifluoromethylpropene, di- or trifluorobenzene, di(trifluoromethylbenzene), and octafluorotoluene.

15. The method as claimed in claim 14 wherein the fluorocarbon compound is hexafluoropropene.

16. The method as claimed in claim 9 wherein the film has a dielectric constant of between about 2 and about 3.6.

17. The method as claimed in claim 9 wherein the reactive gas mixture additionally comprises a carrier gas.

18. The method as claimed in claim 9 wherein the reaction is induced by exposing the reactive gas mixture to plasma at a power of 20 to 1000 W, a pressure of 1 to 10,000 mTorr and a temperature of 25 to 500° C.

19. The method as claimed in claim 9 wherein the oxygen providing gas is nitrous oxide.

20. The method as claimed in claim 1 wherein the substrate is a semiconductor substrate.

21. The method as claimed in claim 9 wherein the substrate is a semiconductor substrate.

\* \* \* \* \*